Figure 1:
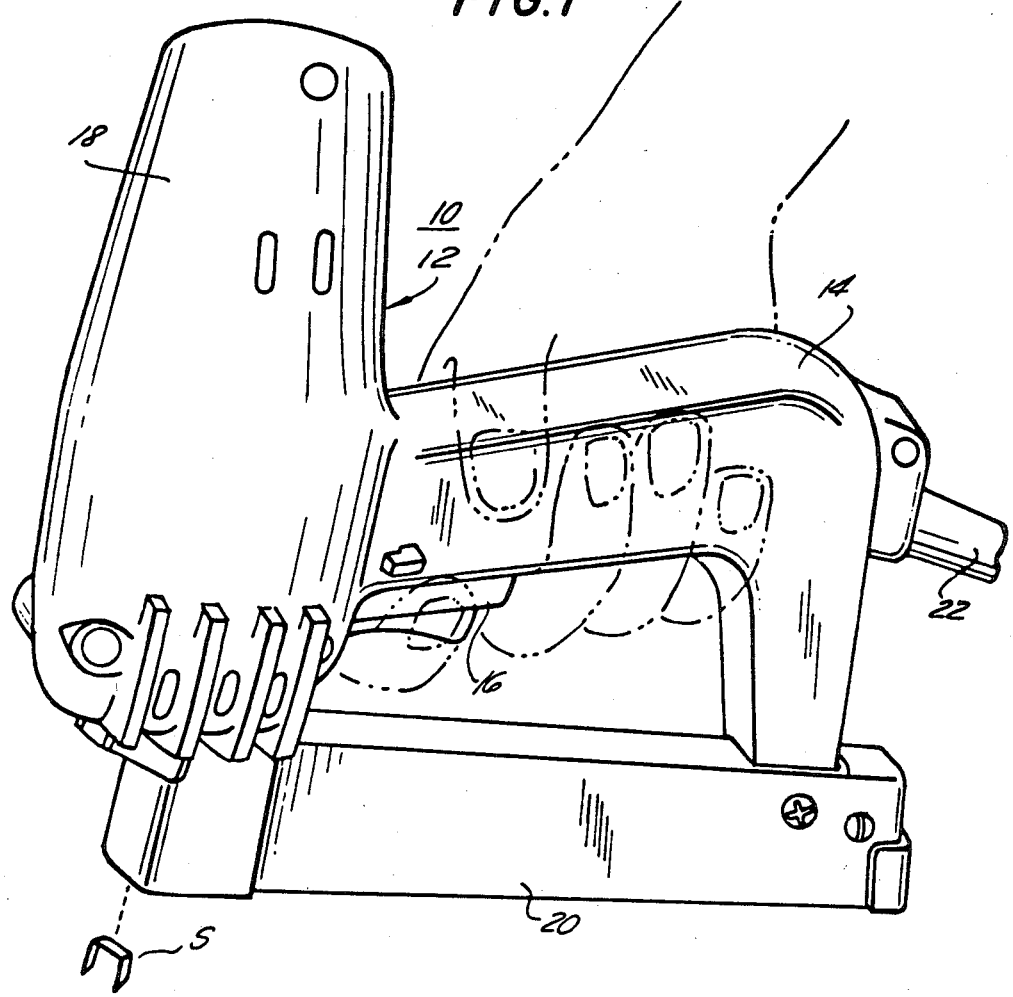

United States Patent [19]

Weigert

[11] Patent Number: 4,556,803
[45] Date of Patent: Dec. 3, 1985

[54] TRIGGER SWITCH CIRCUIT FOR SOLENOID-ACTUATED ELECTRIC HAND TOOL

[75] Inventor: Hans Weigert, Ridgewood, N.J.

[73] Assignee: Electro-Matic Staplers, Inc., Saddle Brook, N.J.

[21] Appl. No.: 600,398

[22] Filed: Apr. 16, 1984

Related U.S. Application Data

[63] Continuation-in-part of Ser. No. 584,735, Feb. 29, 1984, abandoned.

[51] Int. Cl.⁴ .......................... B25C 5/00; H02P 1/18
[52] U.S. Cl. .................................... 307/140; 310/50; 227/131; 323/318; 200/242
[58] Field of Search .......... 307/140; 200/242, 159 A; 310/50, 30; 227/31; 323/318

[56] References Cited

U.S. PATENT DOCUMENTS

| | | | |
|---|---|---|---|
| 3,346,163 | 10/1967 | Manganaro | 227/131 |
| 3,493,702 | 2/1970 | Ramstetter | 200/242 |
| 3,589,587 | 6/1971 | Manganaro | 227/131 |
| 3,766,455 | 10/1973 | Zakrewsky et al. | 310/30 X |
| 4,370,579 | 1/1983 | Kobayashi et al. | 310/71 X |

*Primary Examiner*—A. D. Pellinen
*Assistant Examiner*—Todd E. DeBoer
*Attorney, Agent, or Firm*—Pasquale A. Razzano

[57] ABSTRACT

An electrically powered hand tool, such as a staple gun, can employ an electrical driver, such as a solenoid, which is actuated by a trigger circuit in response to depression of a trigger on the handle of the device. The trigger circuit can include a circuit board dimensioned to fit into the handle of the staple gun, and having AC input leads. A circuit formed of conventional electronic components delivers a burst of power to output leads which are in turn connected to a driver solenoid. This circuit is actuated to deliver the power burst by opening of a switch formed of two switch members: one switch member has a first flexible resilient conductive leaf formed, e.g., of an alloy of copper, extending beyond an edge of the board; the other member has a flexible resilient leaf with a bent-in pointed end contacting a side of the first blade. These blades are biased against each other to form a normally-closed switch. When the first blade is moved in one direction, the switch opens. When the first blade returns in the other direction to close the switch, the pointed end of the other resilient leaf of blade scratches off corrosion at the contact area of the two members. This permits low current (1 ma) to be used as a control current through the switch.

10 Claims, 5 Drawing Figures

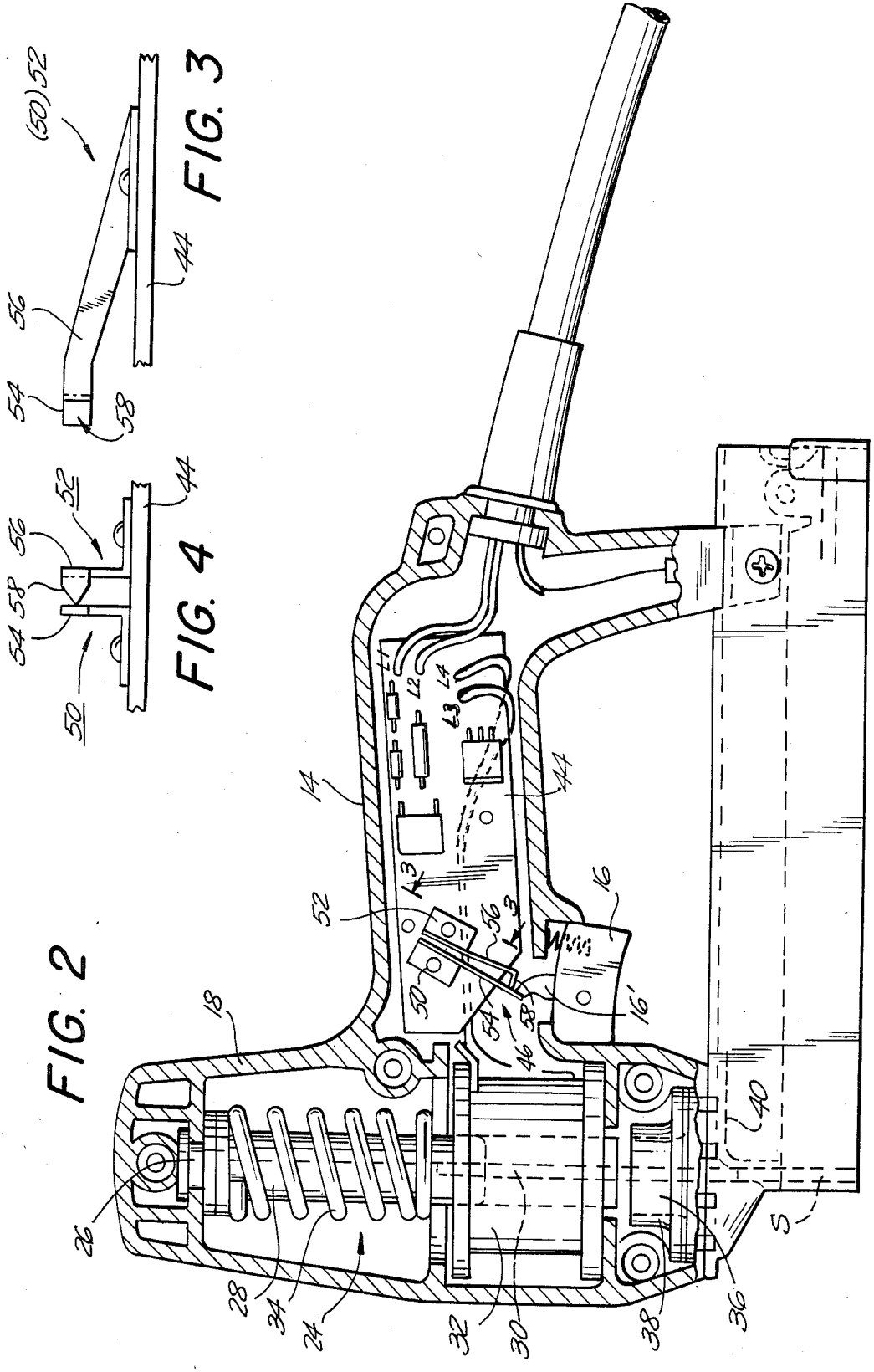

TRIGGER SWITCH CIRCUIT FOR SOLENOID-ACTUATED ELECTRIC HAND TOOL

This is a continuation-in-part of my copending U.S. patent application Ser. No. 584,735, filed Feb. 29, 1984, now abandoned.

This invention relates to trigger switch mechanisms for electrical apparatus, especially electrical hand tools, such as electric staple guns. More specifically, this invention is directed to a trigger switch mechanism for use in an electronically-controlled electric hand tool.

In state-of-the-art and previous electric staple guns, and in other similar electric hand tools, a microswitch is actuated by the hand tool's trigger to close or open in response to depression or release of the trigger.

In the case of an electric stapler, it is conventional to use this microswitch to control the burst of power supplied to the driving solenoid of the stapler. For each depression of the manual trigger, the stapler delivers or "shoots" a single staple and drives the same into wood, wall board, fabric, or other workpiece. Normally, an electronic circuit, based on the silicon controlled rectifier (SCR) is employed and a small control current is fed through the microswitch to control the rather large burst of power that is delivered to the solenoid.

In the conventional electric staple gun circuit, the microswitch is of the normally open type, and the shot of power is delivered by the electronic circuit upon closing of the microswitch. Normally, the working current or control current passing through the microswitch is on the order of only a few milliamps, perhaps even less than one milliamp. These microswitches are susceptible to moisture problems, and can wear out or corrode after a period of use. If higher currents were used, the corrosion would not be a problem, as the current passing through the switch would "burn off" any corrosion. However, where low current is used, as it is here, the contacts in the microswitch do not remain clean. As a result, in the conventional electric staple gun it is quite common that after only a few weeks or months corrosion in the switch will cause the trigger circuit to misoperate.

Accordingly, it is a principal object of this invention to avoid these problems of the prior art.

It is a more specific object of this invention to provide a trigger switch in which the problem of corrosion at low operating currents is avoided, because the corrosion is removed by mechanical actuation of the switch members.

It is still another object of this invention to provide a trigger switch mechanism which is suitable to be used for actuation of an electric hand tool, and which can be configured as a normally closed, rather than normally open switch, so that the electronic circuitry for powering the solenoid can be triggered much more reliably.

In accordance with an aspect of this invention, a trigger switch circuit is provided for an electric hand tool, such as a solenoid-driven power stapler, of the type having a casing, a manually actuated trigger situated in the casing, and electric driving means, such as a solenoid, within the casing. The trigger switch circuit comprises input leaves to be coupled to a source of AC power, a mechanical switch actuated by the trigger, and electronic circuit means coupled to the input leaves, to the switch, and to the electrical driving means for providing a burst of power to the latter when the switch is actuated by the trigger. The electronic circuitry provides a small control current through the switch to control the power burst to the solenoid.

With the improvement of this invention, the circuitry is operative to be actuated by opening of the switch to deliver the power burst. Accordingly, the switch is formed of a first and a second conductive member, the first member having a first flexible resilient conductive leaf fixed at one end and extending at another free end thereof to be contacted by the trigger. The second member has a second resilient conductive leaf fixed at one end and with a bent-in member at a free end thereof with a terminus (i.e., point) contacting a side of the first flexible resilient conductive leaf. With this arrangement, when the first conductive member is moved in one direction by actuation of the manual trigger, the switch opens, and the when the trigger releases the conductive member, the resilience of the first conductive leaf moves the later in the opposite direction and brings the two members back into electrical contact to close the switch. The flexing of the first and second leaves moves the terminus of the bent-in member along the side of the first conductive leaf to scratch away corrosion thereon.

Preferably, the circuitry includes electronic components mounted on a printed circuit board, and a first and second switch members are mounted at their fixed ends onto the printed circuit board, with at least the free end of the first flexible conductive leaf protruding beyond the edge of the printed circuit board.

Figure 5:
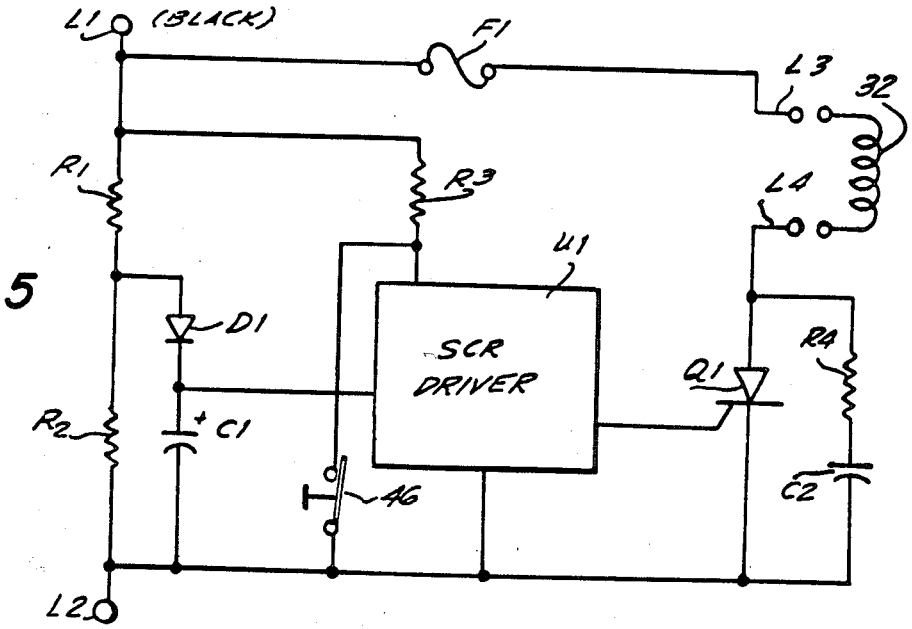

The above and many objects, features, and advantages of this invention will be more fully understood from the ensuing detailed description of a preferred embodiment thereof, which is to be considered in connection with the accompanying drawings, in which FIG. 1 is a perspective view of a power staple gun incorporating a trigger switch circuit embodying the present invention;

FIG. 2 is a cross sectional view of the staple gun of FIG. 1, showing a printed circuit board featuring the particular switch mechanism according to the embodiment of this invention;

FIGS. 3, and 4 are front and side elevational views, respectively, of the circuit board shown in FIG. 2; and FIG. 5 is a schematic circuit diagram of the electronic circuitry of the preferred embodiment of this invention.

With reference to the drawings, and initially to FIG. 1 thereof, a power staple gun 10 is shown to have a plastic housing assembly 12 including a drip portion 14 in which a finger-actuated trigger 16 is reposed, and a head 18 for housing a solenoid driver mechanism, to be described hereinafter.

A staple magazine 20 is fastened to the housing 12, and a cord set 22 extends from one end of the grip portion 14.

A workman can pick up and manipulate the gun 10 by means of the grip portion 14, and depress the trigger 16 one finger. When the operator depresses the trigger 16, the solenoid driver mechanism within the head 18 drives one staple S out from the end of the magazine 20, as shown in FIG. 1.

As is perhaps better shown in cross section in FIG. 2, the staple gun 10 has an electromagnetic drive assembly 24, comprising an upper bumper 26, a plunger 28 to which is connected a flat knife 30, and a solenoid coil assembly 32 for pulling the plunger 28 downward when current is applied thereto. A return spring 34 biases the plunger upwards against the upper bumper 26.

A lower bumper 36 is held in a bumper retainer 38 serves to guide the path of the knife 30 and also limits the downward movement of the plunger 28. A knife backup plate 40, shown in ghost lines, guides the knife 30 to the top of a staple S situated at the end of the magazine 20, so that when the drive assembly 24 is actuated, the plate guides the knife 30, and the latter comes down sharply against the staple S to drive it from the magazine 20 into a workpiece.

Also shown within the grip portion 14 of the housing 12 is a solid-state trigger switch circuit 42 formed of electrical components situated on a printed circuit board 44.

A trigger switch assembly 46 is mounted on this board, and is actuated by an arm or protuberance 16' of the trigger 16.

As shown also in FIGS. 3 and 4, the circuitry on this board includes a pair of leads $L_1$ and $L_2$ connected to the cord set 22, and another pair of leads $L_3$ and $L_4$ coupled to the solenoid coil assembly 32. On the printed circuit board 44 there are also disposed conventional electronics components which are connected to the leads $L_1$-$L_4$ and to the trigger switch 46. This circuitry provides a small control current to the latter, and provides a burst of power to the solenoid coil assembly 32 when the trigger switch 46 is opened.

The switch 46 is formed of first and second switch members 50 and 52, each having a spade portion at one end anchored onto the printed circuit board 44. The switch member 50 has a first flexible resilient conductive leaf or blade 54 formed, for example, of a copper alloy, with a free end thereof extending over an edge of the printed circuit board 44 to be engaged by the trigger protuberance 16'. The other switch member 52 has a flexible resilient leaf or blade 56 with its free end arranged as a bent-in pointed member 58. A sharp point on the pointed member 58 contacts a side of the blade or leaf 54. These leaves 54 and 56 are arranged generally parallel to each other and biased against each other so that the switch 46 is normally closed.

When the lead 54 is moved in the direction of the arrow 60, by urging of the trigger protuberance 16', the switch 46 opens.

However, when the protuberance 16' releases the flexible blade or leaf 54, the resilience of the latter urges the flexible leaf 54 back against the bent-in pointed member 58 to close the switch.

The problem of corrosion at low operating current is avoided by operation of the blades or leaves 54 and 56. That is, when these blades or leaves 54 and 56 flex closed upon movement in the direction opposite to the arrow 60, the point of the bent-in pointed member 58 moves along the surface of the side of the leaf or blade 54, so that the usual thin layer of corrosion is scratched away from the contact area of the leaf or blade 54.

Also, because the switch 46 is configured as a normally closed, rather than normally open switch, the circuit 42 is triggered much more reliably.

In this embodiment, the printed circuit board 44 has one chamfered corner, to define one angled edge of the board 44. Preferably, the trigger switch 46 has at least the flexible leaf 54 extending over this angled edge of the printed circuit board 44.

A favorable embodiment of the circuit 42 is shown schematically in FIG. 5. Here, leads $L_1$ and $L_2$, which have white and black insulation, respectively, and which are coupled to the cord set 22, are bridged by a voltage divider arrangement of resistors $R_1$ and $R_2$, having nominal values, e.g., of 100 K and 5.6 K, respectively. The lead $L_1$ is connected through a fuse $F_1$ to the lead $L_3$, and thence to the solenoid assembly 32. The lead $L_1$ is also connected through a resistor $R_3$, having a nominal value of 180 K, to a integrated-circuit SCR driver circuit $U_1$, and also to one terminal of the trigger switch 46, another terminal of which is connected to the lead $L_2$. A low-voltage power supply is formed of a diode $D_1$ coupled to the junction of the resistors $R_1$ and $R_2$, and a capacitor $C_1$, having a nominal value of 33 microfarads, and 10 volts working voltage. This arrangement provides a DC voltage of about 4.5 volts to a power supply terminal of the driver circuit $U_1$ and a switch current of not more than substantially five milliamps. A ground terminal of the circuit $U_1$ is connected to the lead $L_2$.

A silicon controlled rectifier (SCR) $Q_1$ has an anode connected through the lead $L_4$ to the solenoid assembly 32, a cathode connected to the lead $L_2$, and a gate connected to a control output of the SCR driver circuit $U_1$. A relaxation circuit formed of a resistor $R_4$, having a nominal value of 22 ohms, connected in series with a capacitor $C_2$, having a nominal value of 0.1 microfarads, at 250 volts, bridges the anode and cathode of the SCR $Q_1$.

The SCR driver circuit $U_1$ actuates the SCR $Q_1$ when the switch 46 is opened, so that the opening of the switch 36 results in the delivery of a burst of power, through the leads $L_3$ and $L_4$, to the solenoid assembly 32.

While a trigger switch circuit for an electric hand tool has been described in detail hereinabove with reference to a single specific embodiment, it should be understood that the invention is not limited to that one embodiment, and that many modifications and variations thereof will become apparent to those of skill in the art without departure from the scope and spirit of this invention, as defined in the appended claims.

I claim:

1. In a trigger switch circuit used in an electric hand tool of the type having a casing, a manually actuated trigger, and electrical driving means, the circuit comprising input leads to be coupled to a source of AC power, a mechanical switch actuated by said trigger, and electronic circuit means coupled to said input leads, said switch, and said electrical driving means, said electronic circuit means providing a burst of power to the electrical driving means when said switch is actuated by said trigger, the circuit means providing a small pilot control current through said switch, said pilot control current controlling the power burst to said driving means; the improvement wherein said circuit means is sensitive to a break in said pilot control current and is actuated by opening of said switch to deliver said power burst; and said switch is formed of a first and a second conductive member, the first member having a first flexible resilient conductive leaf fixed at one end and extending at another, free end thereof to be urged by said trigger; said second member including a second resilient conductive leaf fixed at one end and having a bent-in member at a free end thereof with the bent-in member having a sharp point as its terminus contacting a side of the first flexible resilient conductive leaf, whereby when the first conductive member is moved in one direction by actuation of said trigger, the switch opens, and when the trigger releases the first conductive member, the resilience of the first conductive leaf moves the latter in the opposite direction and brings the two members back into contact to close the switch, and flexing of the first and second leaves moves the terminus of said bent-in member along the side of the first conductive leaf with the pointed terminus being operative to scratch away corrosion from an area of contact between said first and second members.

2. Trigger switch circuit according to claim 1, wherein said circuit means includes electronics components mounted on a printed circuit board, and said first and second switch members are mounted at said one ends directly onto said printed circuit board.

3. Trigger switch circuit according to claim 2, wherein said first and second conductive leaves are disposed generally parallel to one another.

4. Trigger switch circuit according to claim 2, wherein said free end of said first flexible conductive leaf protrudes beyond an edge of said printed circuit board.

5. Trigger switch circuit according to claim 1, wherein said circuit means provides a control current to said switch of not more than substantially five milliamps.

6. Trigger switch circuit according to claim 5, wherein said circuit means provides a control current of less than about one milliamp.

7. Trigger switch mechanism according to claim 1, wherein said electrical driving means includes a solenoid and associated plunger means.

8. Trigger switch mechanism according to claim 1, wherein said electric hand tool is an electric staple gun.

9. In a trigger switch circuit used in an electric hand tool of the type having a casing, a manually actuated trigger, and electrical driving means, the circuit comprising input leads to be coupled to a source of AC power, a mechanical switch actuated by said trigger, and solid state electronic circuit means mounted on a circuit board within said hand tool and electrically coupled to said input leads, said switch, and said electrical driving means, said electronic circuit means having a solid state element generating a burst of power furnished to the electrical driving means when said switch is actuated by said trigger, the solid state circuit means providing a small pilot current through said switch said pilot current controlling the power burst to said driving means; the improvement wherein said solid state circuit means is sensitive to a break in said pilot current and is operative to be actuated by opening of said switch to deliver said power burst; said pilot current is less than about one milliamp; and said switch is formed of a first and a second conductive member, the first member having a first flexible resilient conductive leaf mounted directly on said circuit board at one end and extending at another, free end thereof to be urged by said trigger; said second member including a second resilient conductive leaf mounted directly on said circuit board at one end and having a bent-in member at a free end thereof with a terminus contacting a side of the first flexible resilient conductive leaf, whereby when the first conductive member is moved in one direction by actuation of said trigger, the switch opens, and when the trigger releases the first conductive member, the resilience of the first conductive leaf moves the latter in the opposite direction and brings the two members back into contact to close the switch, and the flexing of the first and second leaves moves the terminus of said bent-in member along the side of the first conductive leaf to scratch away corrosion thereon.

10. Trigger switch circuit according to claim 9, wherein said bent-in member has a sharp point as its terminus, with said point being operative to scratch away corrosion from an area of contact between said first and second members.

* * * * *